United States Patent [19]

Akao et al.

[11] Patent Number: 4,922,288
[45] Date of Patent: May 1, 1990

[54] IMAGE RECORDING APPARATUS

[75] Inventors: Michitoshi Akao, Nagoya; Kenji Sakakibara, Ichinomiya; Tokunori Katoh, Ichinomiyashi; Yukichi Sawaki, Gifu, all of Japan

[73] Assignee: Brother Kogyo Kabushiki Kaisha, Aichi, Japan

[21] Appl. No.: 244,681

[22] Filed: Sep. 14, 1988

[30] Foreign Application Priority Data

Sep. 24, 1987 [JP] Japan ................... 62-239246

[51] Int. Cl.[5] ..................... G03B 27/32; G03B 27/52
[52] U.S. Cl. ......................................... 355/27; 355/67
[58] Field of Search .................... 355/27, 67; 430/138, 430/403; 354/302

[56] References Cited

U.S. PATENT DOCUMENTS 4,748,475  5/1988  Ishiyama et al. .................... 355/27
4,770,972  9/1988  Nelson et al. .................... 430/403 X Primary Examiner—Richard A. Wintercorn
Attorney, Agent, or Firm—Kane, Dalsimer, Sullivan, Kurucz, Levy, Eisele and Richard

[57] ABSTRACT

In an image recording apparatus utilizing a photo and pressure sensitive recording medium, an exposure unit emits a light to shine upon an original, and directs the light reflected from the original, toward the recording medium to expose the same thereby forming a latent image. A pressure developing unit is provided for pressurizing the exposed recording medium to develop the latent image thereon. A transport arrangement transports the recording medium from the exposure unit to the pressure developing unit. A regular reflection unit is provided for regular-reflecting the light from the exposure unit to expose the recording medium to the regular reflection light, thereby curing the recording medium.

14 Claims, 4 Drawing Sheets

IMAGE RECORDING APPARATUS

BACKGROUND OF THE INVENTION

This invention relates generally to image recording apparatuses, and more particularly, to an image recording apparatus which employs a photo and pressure sensitive recording medium.

An image recording apparatus of the kind referred to above is known from Japanese Patent Application Laid-Open No. 61-129971, which comprises an exposure unit for exposing a photo and pressure sensitive recording medium to form a latent image onto the same, pressure developing means for pressurizing the recording medium having been exposed, to develop the latent image, and a transport arrangement for transporting the recording medium from the exposure unit to the pressure developing means.

However, the conventional apparatus does not comprise a mechanism in which a regular reflection light from the exposure unit is utilized to cure the recording medium regardless of image information on an original. By this reason, the recording medium uncured is transported to the pressure developing means, resulting in such a problem as to contaminate pressure rolls and the like of the pressure developing means.

SUMMARY OF THE INVENTION

It is therefore an object of this invention to provide an improved image recording apparatus capable of preventing an uncured photo and pressure sensitive recording medium from contaminating components of pressure developing means, and also capable of shortening a time required for transportation of the recording medium.

For the above purpose, according to the invention, there is provided an image recording apparatus utilizing a photo and pressure sensitive recording medium, which comprises:

exposure means for emitting a light to shine upon an original and for directing the light reflected from the original, toward the recording medium to expose the same thereby forming a latent image;

pressure developing means for pressurizing the exposed recording medium to develop the latent image thereon;

transport means for transporting the recording medium from the exposure means to the pressure developing means; and regular reflection means for regular-reflecting the light from the exposure means to expose the recording medium to the regular reflection light, thereby curing the recording medium.

BRIEF DESCRIPTION OF THE ACCOMPANYING DRAWINGS

DESCRIPTION OF THE EMBODIMENTS

Figure 1:
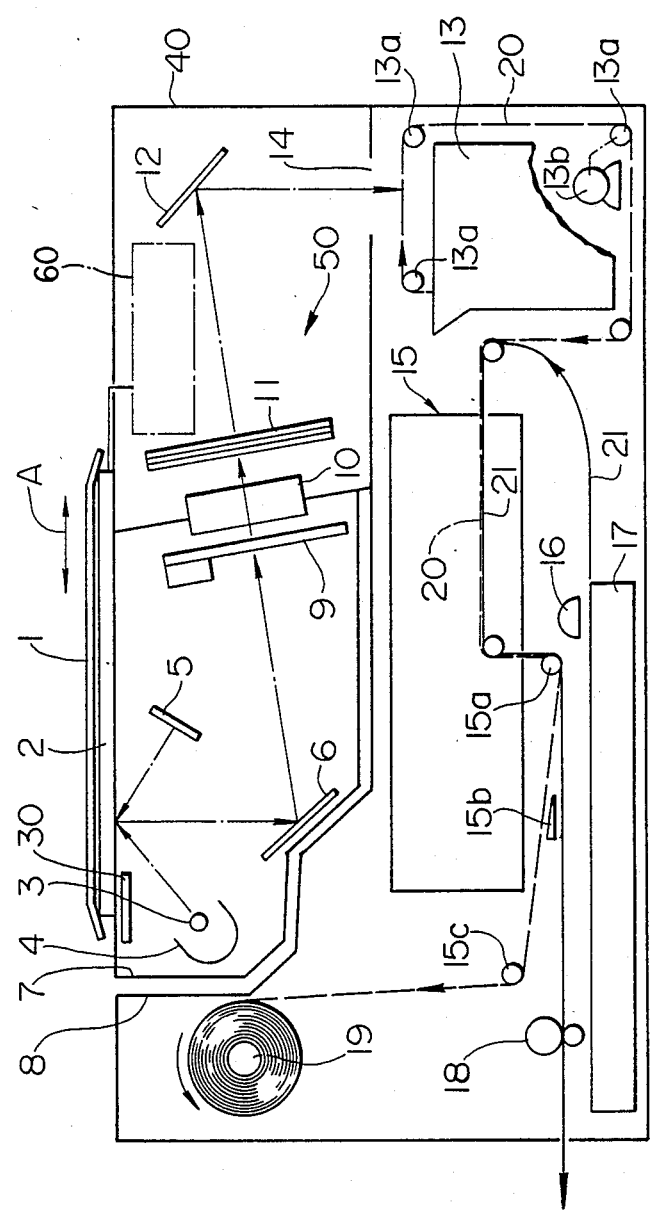
FIG. 1 is a schematic view of an image recording apparatus embodying the invention.

Referring to FIG. 1, there is schematically shown an image recording apparatus or a copying machine embodying the invention. The apparatus is of type which utilizes a color compatible photo and pressure sensitive recording medium disclosed in U.S. Pat. No. 4,399,209. The recording medium is composed of a continuous web and a developing sheet. The continuous web is coated with microcapsules each containing dye precursor. The developing sheet is coated with developer. It is to be understood, however, that any other suitable photo and pressure sensitive recording media can be employed in the apparatus.

As shown in FIG. 1, the apparatus comprises a body 40. A transparent glass platen 2 is mounted to the top of the body 40 and can be covered with a platen cover 1. An original can be set between the platen 2 and the platen cover 1 in such a manner that a side of the original having carried thereon image information faces downwardly. At exposure subsequently to be described, the platen 2 as well as the platen cover 1 is reciprocatively moved together with the original by a moving mechanism 60 in a direction indicated by an arrow A in FIG. 1.

An exposure unit 50 includes a light source 3 for emitting a light with which the original is illuminated. The light source 3 is arranged below the platen 2 and at an upper location within the body 40. A cold mirror 4 is arranged at a location on the rear and left of the light source 3. The light source 3 shines upon a predetermined line on the information side of the original. The predetermined line extends perpendicularly to the arrowed direction A. Heat waves emitted from the light source 3 are transmitted through the cold mirror 4, while visible radiation from the light source 3 is reflected forwardly by the cold mirror 4. Thus, when the plate 2 as well as the platen cover 1 is moved in the arrowed direction A, the information side of the original passes successively over the predetermined line illuminated with the light from the light source 3.

An optical system includes a reflecting mirror 5 arranged at a location on the right of the light source 3. The reflecting mirror 5 reflects a part of the light emitted from the light source 3, which is not directed toward the original, to cause the reflected light part to shine upon the predetermined line on the information side of the original. Below the predetermined line, a reflecting mirror 6 is arranged for directing the light reflected by the predetermined line, toward the right within the body 40. At a location on the right of the reflecting mirror 6, a shutter 9 is arranged for intercepting or passing the light reflected by the reflecting mirror 6.

A lens system 10 is arranged on the right of the shutter 9. On the right of the lens system 10, a filter 11 is arranged for permitting light components for respective cyan, magenta and yellow to be transmitted selectively through the filter 11. At a right upper location within the body 40, a reflecting mirror 12 is arranged for reflecting downwardly the light having passed through the filter 11. Below the reflecting mirror 12, an exposure station 14 is arranged for exposing a portion of the previously mentioned continuous web 20 to the light reflected by the reflecting mirror 12. Below the exposure station 14, a cartridge or Patrone 13 is arranged for accommodating therein an unused continuous web 20 wound into a roll. A plurality of web feed rollers 13a are arranged around the web cartridge 13 for feeding the web 20. A drive motor 13b is operatively connected to the web feed rollers 13a to transport the web 20 in synchronism with the movement of the platen 2. The web 20 is transported around the cartridge 13 by the drive motor 13b and the web feed rollers 13a, and is conveyed to a pressure developing unit 15 which is arranged on the left of the cartridge 13. Since the original moves together with the platen 2 in synchronism with transportation of the web 20, a latent image corresponding to the image information on the original is formed onto the portion of the web 20 at the exposure station 14.

Below the pressure developing unit 15, a sheet cartridge 17 is arranged which accommodates therein a stack of developing sheets 21 of cut sheet type. Above the sheet cartridge 17, a roller 16 is arranged for drawing the developing sheets 20 one by one out of the sheet cartridge 17. The drawn developing sheet 20 is fed by the roller 16 toward the web cartridge 13. The developing sheet 21 is brought into close contact with the portion of the web 20 having carried thereon the latent image. That is, the developing sheet 21 and the web 20 are superimposed one upon the other and are transported toward the pressure developing unit 15 for developing the latent image on the portion of the web 20, onto the developing sheet 21. In this connection, the pressure developing unit 15 employed in the illustrated embodiment is similar to that disclosed in detail in Japanese Patent Application No. 62-64593, and the detailed description of the pressure developing unit 15 will therefore be omitted here.

The superimposed web and sheet 20 and 21 are transported downwardly out of the pressure developing unit 15, and are changed in direction to the left by a guide roller 15a. The web and sheet 20 and 21 are then separated from each other by a separator 15b arranged on the left of the guide roller 15a. The web 20 is transported upwardly by a guide roller 15c arranged on the left of the separator 15, so that the used portion of the web 20 is wound around a take-up roller 19 arranged at a left upper location within the body 40. On the other hand, the separated developing sheet 21 is transported to the left. On the left of the separator 15b, a heat-fixing unit 18 is arranged for giving a gloss to the developed image formed on the developing sheet 21. The developing sheet 21 having passed through the heat-fixing unit 18 is discharged out of the body 40.

Figure 2:
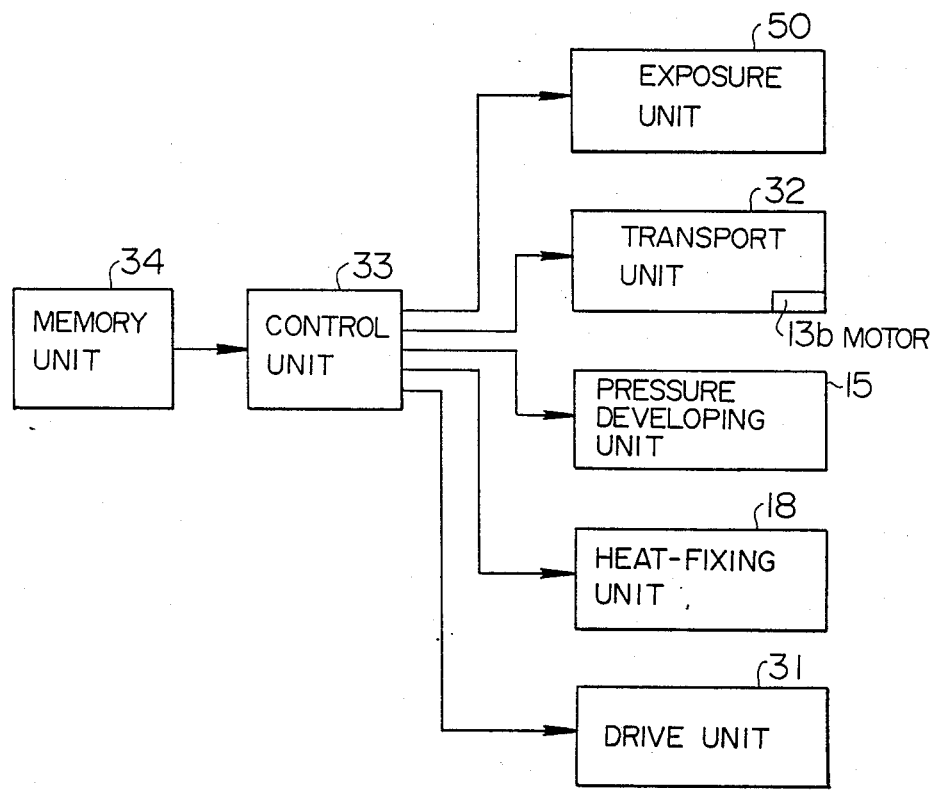
FIG. 2 is a block diagram showing the relationship among various components of the apparatus illustrated in FIG. 1.

As shown in FIG. 2, the image recording apparatus comprises a control unit 33 for controlling the operation of the apparatus. Connected to the control unit 33 are the aforesaid exposure unit 50, a transport unit 32 including the drive motor 13b and the like, the aforesaid pressure developing unit 15, the aforesaid heat-fixing unit 18, and a drive unit 31 subsequently to be described. A memory unit 34 having stored therein a control program is also connected to the control unit 33.

Figure 3:
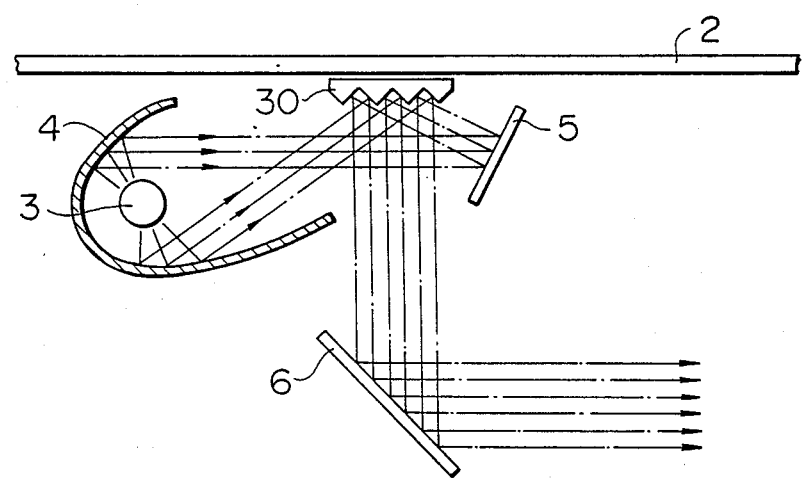
FIG. 3 is a fragmentary enlarged view of an exposure unit incorporated in the apparatus illustrated in FIG. 1, showing the principle of a regular reflection plate.
Figure 4:
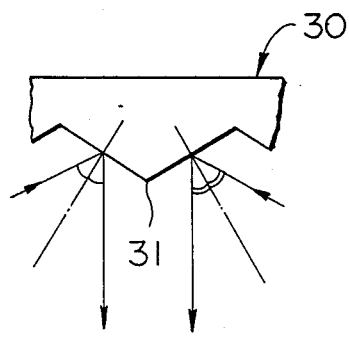
FIG. 4 is a fragmentary enlarged view of the regular reflection plate shown in FIG. 3.
Figure 5:
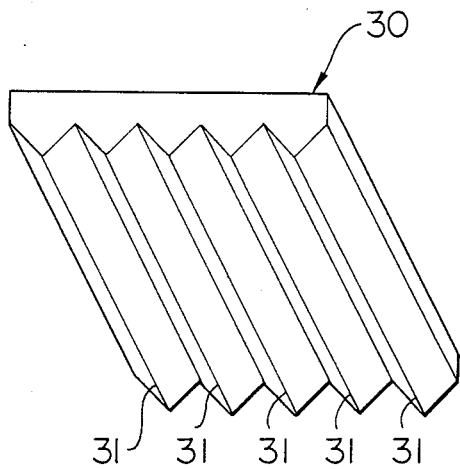
FIG. 5 is an enlarged perspective view of the regular reflection plate shown in FIG. 3.

Referring back to FIG. 1, a movable regular reflection plate 30 is arranged below the platen 2 for regular-reflecting the light emitted from the light source 3 to perfectly expose a portion of the web 20 adjacent the portion thereof having carried thereon the latent image. Further, the aforementioned drive unit 31 shown in FIG. 2 is also arranged below the platen 2 for moving the regular reflection plate 30 between an inoperative position shown in FIG. 1 and an operative position shown in FIG. 3 where the regular reflection plate 30 regular-reflects the light from the light source 3. It is desirable that the regular reflection plate 30 has a surface like a mirror surface high in reflectivity. FIG. 3 shows the principle of the regular reflection plate 30, FIG. 4 is a perspective view showing the regular reflection plate 30, and FIG. 5 is a fragmentary view showing the reflecting surface of the regular reflection plate 30. As will be seen from FIGS. 3 through 5, the reflecting surface of the regular reflection plate 30 is formed by a corrugated surface in which a plurality of ridgelines 31 extend parallel to each other and are spaced from each other equidistantly.

The operation of the illustrated apparatus will next be described.

With the original stopping at an initial position, the light source 3 and the reflecting mirror 5 shine upon the predetermined line on the original. A light reflected from the original is directed toward the right by the reflecting mirror 6, and is passed through the shutter 9, the lens system 10 and the filter 11. The light is then reflected downwardly by the reflecting mirror 12, and illuminates a portion of the web 20 at the exposure station 14.

As the platen 2 and the cover 1 start to move together with the original in the arrowed direction A, the web 20 begins to be transported and moved around the web cartridge 13 by the rollers 13a and the drive motor 13b. When the movement of the original is completed, a latent image corresponding to the image information on the original is formed onto the portion of the web 20. The portion of the web 20 extending around the cartridge 13 is equal to or longer than the original placed upon the platen 2. The portion of the web 20 having carried thereon the latent image is superimposed, in close contact relation, upon the developing sheet 21 drawn out of the cartridge 17 by the feed roller 16. The superimposed web and developing sheet 20 and 21 are inserted into the pressure developing unit 15. The pressure developing unit 15 destroys unexposed microcapsules on the portion of the developing sheet 21, which are low in mechanical strength. The dye precursor squeezed out of the destroyed microcapsules is reacted with the developing agent on the developing sheet 21, thereby developing a color image onto the developing sheet 21.

The portion of the web 20 and the developing sheet 21 discharged out of the pressure developing unit 15 are changed in direction to the left by the roller 15a, and then are separated from each other by the separator 15b. The portion of the web 20 separated from the developing sheet 21 is transported upwardly and is wound around the take-up roller 19. On the other hand, the separated developing sheet 21 is transported to the left, and is passed through the heat-fixing unit 18, whereby color development of the image on the developing sheet 21 is accelerated and a gloss is given to the image. The developing sheet 21 is then discharged out of the body 40.

Before the portion of the web 20 having carried thereon the latent image is inserted into the pressure developing unit 15, the regular reflection plate 30 is moved to the operative position below the predetermined line along which the original is illuminated with the light from the light source 3, simultaneously with completion of movement of the original, in order to cure the microcapsules on a portion of the web 20 adjacent the portion thereof having carried thereon the latent image. Specifically, the light source 3 and the reflecting mirror 5 shine upon the regular reflection plate 30. The light is reflected by the regular reflection plate 30 on the principle shown in FIG. 3. The light from the regular reflection plate 30 is reflected by the reflecting mirror 6, and is passed through the shutter 9, the lens system 10 and the filter 11. The light is then reflected downwardly by the reflecting mirror 12, and illuminates the adjacent portion of the web 20, thereby curing the microcapsules thereon completely. Since the regular reflection light is larger in light quantity or higher in light intensity than the diffuse reflection at the exposure of the original, it is possible for the regular reflection light to expose the adjacent portion of the web 20 for a short period of time. Accordingly, a value of the speed command to the drive motor 13b is raised to transport the web 20 at a high speed. After a predetermined amount of the web 20 is wound up, transportation of the web 20 is stopped. The shutter 9 is then closed, and the light source 3 is switched off. In this manner, since the adjacent portion of the web 20, on which no latent image is formed, is exposed perfectly over the entire surface so that the microcapsules are cured, there is no anxiety that the adjacent portion of the web 20 passing through the pressure developing unit 15 contaminates the pressure rollers and the like thereof. Further, since the adjacent portion of the web 20 can be transported at the high speed at the perfect exposure, it is also possible to shorten a time required for making a copy.

Figure 6:
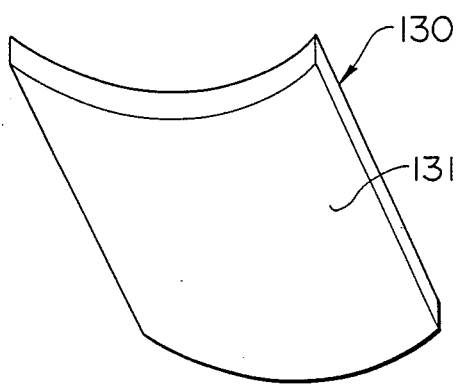
FIG. 6 is a view similar to FIG. 5, but showing a modification of the regular reflection plate.

It is to be understood that the regular reflection plate is not limited to the configuration illustrated in FIGS. 3 through 5, but may have any other suitable configurations. That is, a regular reflection plate 130 illustrated in FIG. 6 may be employed, which has a convexly curved reflecting surface 131.

As described above, the arrangement of the image recording apparatus is such that regular-reflection plate 30 or 130 regular-reflects the light from the light source 3, to cure the portion of the web 20 adjacent the portion thereof having carried thereon the latent image. With such arrangement, the adjacent portion of the web 20 can be exposed perfectly to the light from the light source 3, even if the adjacent portion of the web 30 is transported at a high speed. Thus, it is possible to prevent uncured microcapsules on the adjacent portion of the web 20 from contaminating the pressure rolls and the like of the pressure developing unit 15 when the web 20 is transported through the pressure developing unit 15. Moreover, it is possible for the apparatus to shorten a time required for making a copy.

What is claimed is:

1. An image recording apparatus utilizing a photo and pressure sensitive recording medium, which comprises:
    exposure means for emitting light to shine upon an original and for directing the light reflected from the original, toward the recording medium to expose an area of the same thereby forming a latent image corresponding to an image on said original;
    pressure developing means for pressurizing the exposed recording medium to develop the latent image thereon;
    transport means for transporting the recording medium from said exposure means to said pressure developing means; and
    regular reflection means for regular-reflecting the light from said exposure means to expose an area of the recording medium other than the area exposed by said exposure means to the regular reflection light, thereby curing the recording medium.

2. The image recording apparatus according to claim 1, wherein said adjacent portion of the recording medium is exposed by said regular reflection means after said portion of the recording medium having carried thereon the latent image has been transported by said transport means.

3. The image recording apparatus according to claim 2, wherein the recording medium includes a continuous web coated with microcapsules each containing dye precursor.

4. The image recording apparatus according to claim 1, wherein said regular reflection means includes a regular reflecting member movable between an inoperative position remote from an optical path of the light from said exposure means to the original, and an operative position where said regular reflection member is located on the optical path of the light from said exposure means to regular-reflecting the light.

5. The image recording apparatus according to claim 4, wherein said regular reflection member has a corrugated reflecting surface having a plurality of ridgelines spaced from each other.

6. The image recording apparatus according to claim 4, wherein said regular reflection member has a reflecting surface curved convexly toward said exposure means.

7. An image recording apparatus utilizing a photo and pressure sensitive recording medium including a continuous web, which comprises:
    original support means for supporting an original having carried thereon image information;
    exposure means including light source means for emitting a light to shine upon the original, and optical means for directing the light reflected from the original, toward a portion of the continuous web arranged at an exposure station, to expose said portion of the continuous web thereby forming a latent image onto said portion of the continuous web, the latent image corresponding to the image information on the original;
    pressure developing means for pressurizing said portion of the continuous web to develop the latent image onto the recording medium;
    transport means for transporting said portion of the continuous web from said exposure station to said pressure developing means, and for transporting a portion of the continuous web adjacent said portion thereof having carried thereon the latent image, to said exposure station; and
    regular reflection means arranged between said original support means and said light source means for movement between an inoperative position remote from an optical path of the light emitted from said light source means toward the original supported by said original support means, and an operative position where said regular reflection means is located on said optical path for regular-reflecting the light from said light source means to expose said adjacent portion of the continuous web.

8. The image recording apparatus according to claim 7, wherein said regular reflection means includes a regular reflection member and means for moving said regular reflection member between said operative and inoperative positions, and wherein said regular reflection member has a corrugated reflecting surface having a plurality of ridgelines spaced from each other.

9. The image recording apparatus according to claim 7, wherein said regular reflection means includes a regular reflection member and means for moving said regular reflection member between said operative and inoperative positions, and wherein said regular reflection member has a reflecting surface curved convexly toward said light source means.

10. The image recording apparatus according to claim 7, wherein said light source means is stationary and shines upon a predetermined line on the original supported by said original support means, while said original support means is movable in such a manner that the original passes successively over said predetermined line.

11. An image recording apparatus utilizing a photo and pressure sensitive recording medium coated with a plurality of microcapsules each containing dye precursor, which comprises:

exposure means for emitting light to shine upon an original and for directing the light reflected from the original, toward the recording medium to expose an area of the same thereby forming a latent image corresponding to an image on said original;

pressure developing means for pressurizing the exposed recording medium to develop the latent image thereon;

transport means for transporting the recording medium from said exposure means to said pressure developing means;

regular reflection means, including a regular reflection member being movable between an inoperative position remote from an optical path of light from said exposure means to said original and an operative position at which said regular reflection member is located in the optical path to reflect the light, for regular-reflecting the light from said exposure means to expose an area of the recording medium other than the area exposed by said exposure means to the regular reflection light, thereby curing the recording medium.

12. The image recording apparatus according to claim 11 wherein the area of the recording medium to be exposed by the light reflected by said regular reflecting means is exposed after the area of the recording medium on which a latent image corresponding to an image on said original has been formed is transported by said transport means.

13. The image recording apparatus according to claim 11 wherein said regular reflection member has a corrugated surface having a plurality of ridge lines spaced from each other.

14. The image recording apparatus according to claim 11 wherein said regular reflection member has a reflecting surface curved convexly toward said exposure means.

* * * * *